(12) United States Patent
Schibli

(10) Patent No.: US 12,520,621 B2
(45) Date of Patent: Jan. 6, 2026

(54) CONCENTRATOR PHOTOVOLTAIC MODULE

(71) Applicant: FOXLED1 AG, Hünenberg (CH)

(72) Inventor: Peter Schibli, Hünenberg (CH)

(73) Assignee: FOXLED1 AG, Hünenberg (CH)

( * ) Notice: Subject to any disclaimer, the term of this patent is extended or adjusted under 35 U.S.C. 154(b) by 956 days.

(21) Appl. No.: 17/609,713

(22) PCT Filed: May 7, 2019

(86) PCT No.: PCT/EP2019/061745
§ 371 (c)(1),
(2) Date: Jul. 7, 2022

(87) PCT Pub. No.: WO2020/224770
PCT Pub. Date: Nov. 12, 2020

(65) Prior Publication Data
US 2022/0416106 A1    Dec. 29, 2022

(51) Int. Cl.
| | | |
|---|---|---|
| H10F 77/42 | (2025.01) | |
| H02S 20/23 | (2014.01) | |
| H10F 19/35 | (2025.01) | |
| H10F 77/30 | (2025.01) | |

(52) U.S. Cl.
CPC ........... *H10F 77/488* (2025.01); *H02S 20/23* (2014.12); *H10F 19/35* (2025.01); *H10F 77/306* (2025.01); *H10F 77/484* (2025.01)

(58) Field of Classification Search
CPC ... H01L 31/0547; H02S 40/22; H10F 77/306; H10F 77/484; H10F 77/488
See application file for complete search history.

(56) References Cited

U.S. PATENT DOCUMENTS

| | | | |
|---|---|---|---|
| 9,502,618 B2* | 11/2016 | Kobayakawa | ........ H01L 33/483 |
| 2006/0072222 A1* | 4/2006 | Lichy | ................. G02B 27/0994 |
| | | | 359/861 |
| 2009/0084374 A1* | 4/2009 | Mills | ................... H01L 31/0547 |
| | | | 126/684 |
| 2009/0183764 A1 | 7/2009 | Meyer | |

(Continued)

FOREIGN PATENT DOCUMENTS

| | | |
|---|---|---|
| EP | 2999003 | 3/2016 |
| WO | 2006123194 | 11/2006 |
| WO | 2009023063 | 2/2009 |

OTHER PUBLICATIONS

European Patent Office, "International Search Report, Application PCT/EP2019/061745 filed May 7, 2019", mailed Jan. 23, 2020, 6 pages.

*Primary Examiner* — Mayla Gonzalez Ramos
(74) *Attorney, Agent, or Firm* — Mannava & Kang, P.C.

(57) ABSTRACT

The invention relates to a concentrator photovoltaic module comprising a housing, a photovoltaic chip, at least two electrical contacts for contacting the photovoltaic chip, and a transparent cover. The housing has a recess forming a receiving tray with a recessed bottom portion for receiving the photovoltaic chip. The receiving tray has side walls with at least a first and a second reflective region. The first reflective region is oriented at a first angle with respect to a horizontal plane of the housing and the second reflective region is oriented at a second angle with respect to the horizontal plane of the housing. The first angle is different from the second angle.

18 Claims, 11 Drawing Sheets

(56) References Cited

U.S. PATENT DOCUMENTS

| | | | |
|---|---|---|---|
| 2010/0018570 A1* | 1/2010 | Cashion | H10F 77/484 |
| | | | 136/246 |
| 2011/0155217 A1* | 6/2011 | Yang | H01L 31/044 |
| | | | 136/246 |
| 2011/0162712 A1* | 7/2011 | Tillin | G02B 6/0046 |
| | | | 136/259 |
| 2013/0000695 A1* | 1/2013 | Giri | F24S 50/20 |
| | | | 136/246 |

* cited by examiner

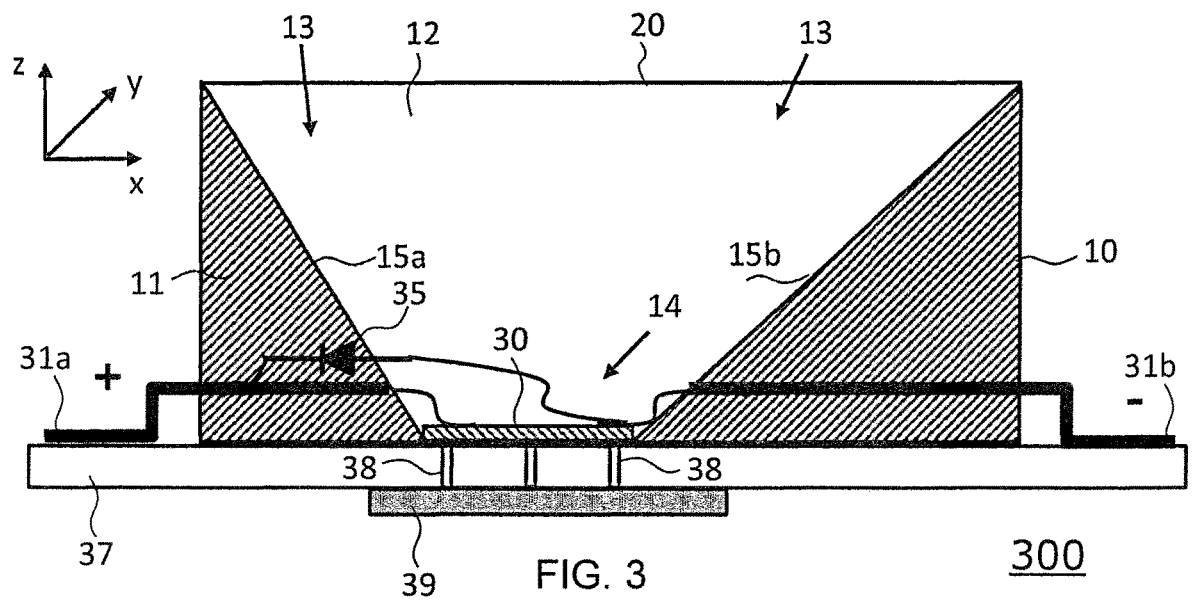
FIG. 3    300
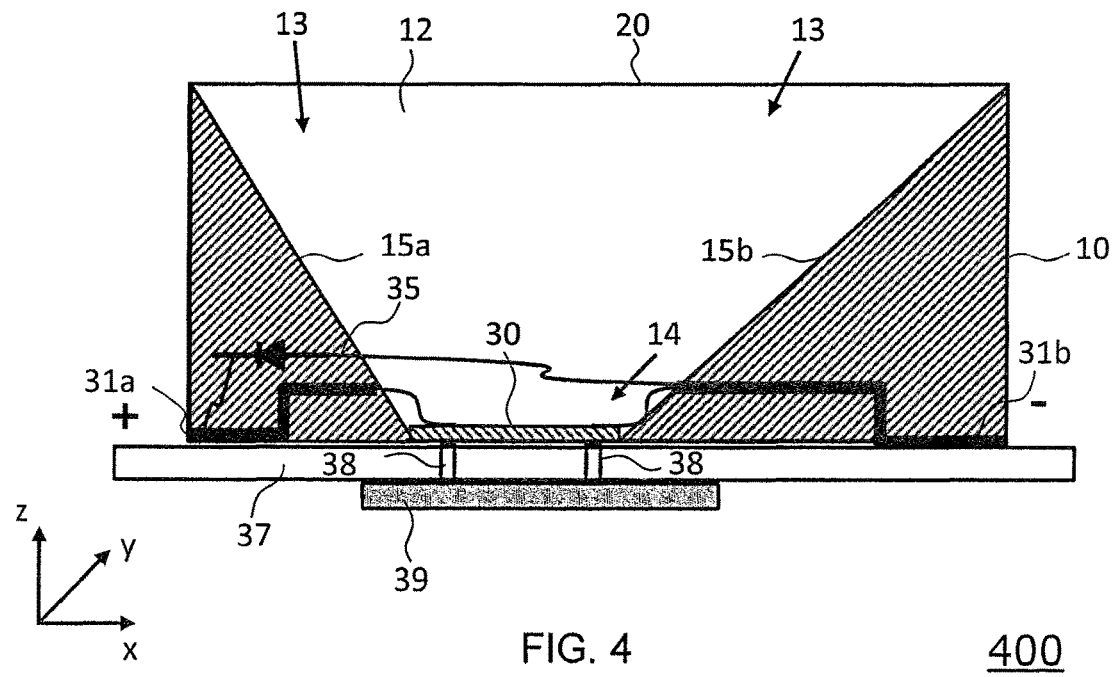
FIG. 4    400

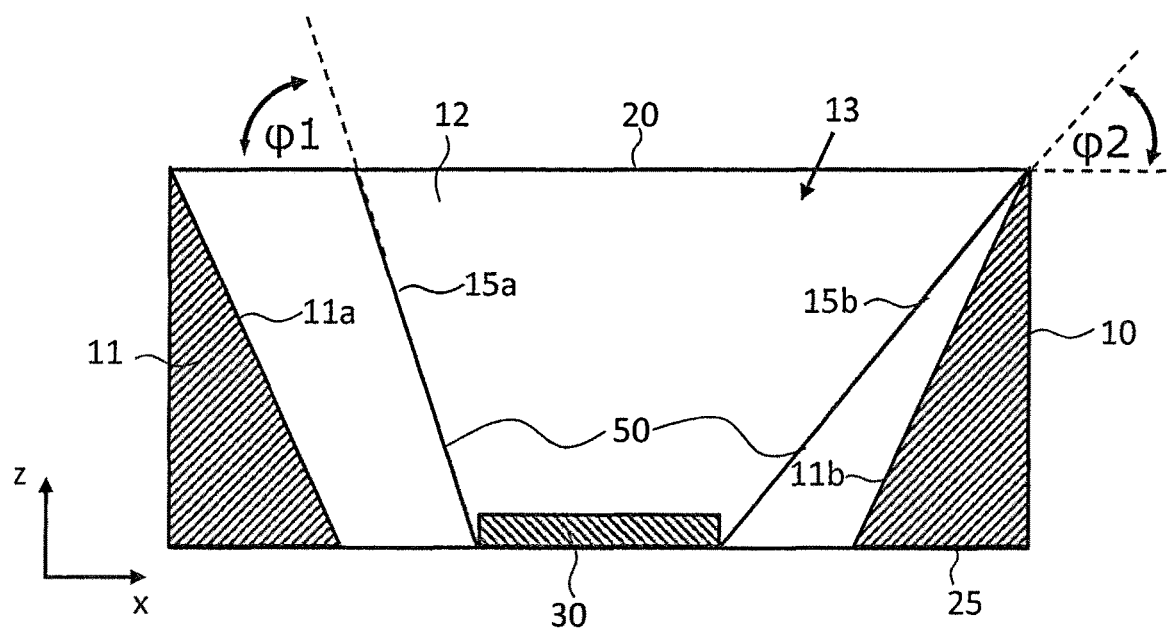
FIG. 5a     500
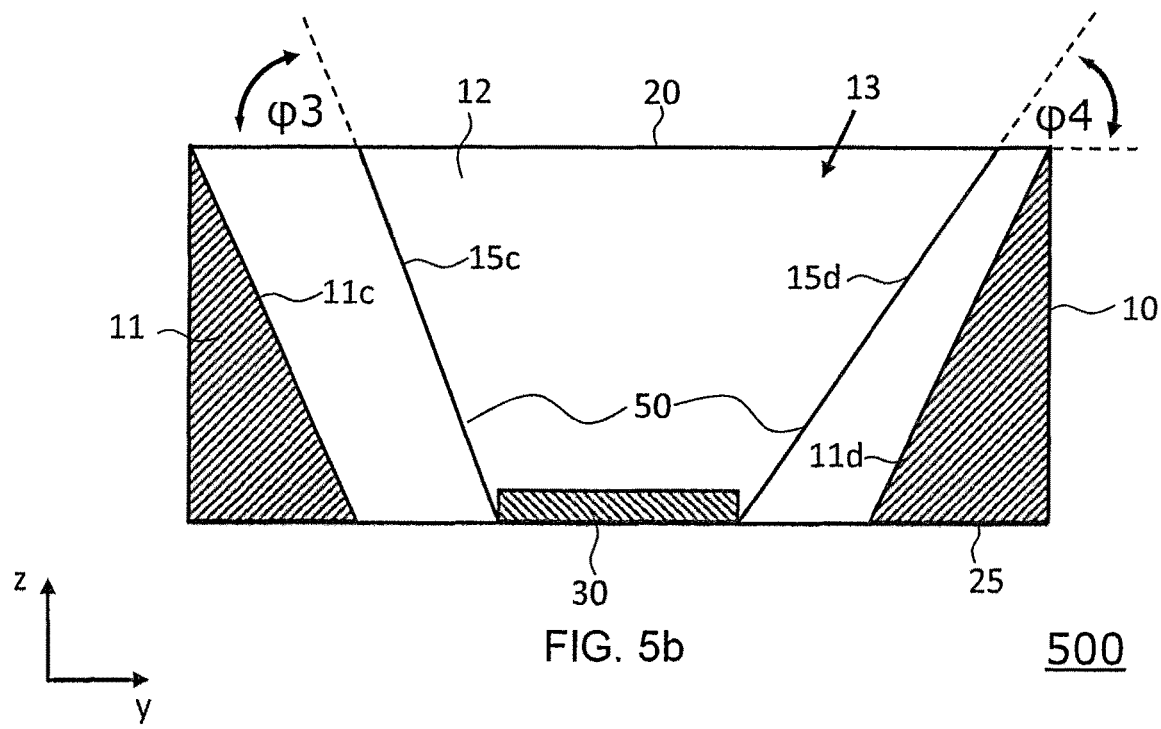
FIG. 5b     500

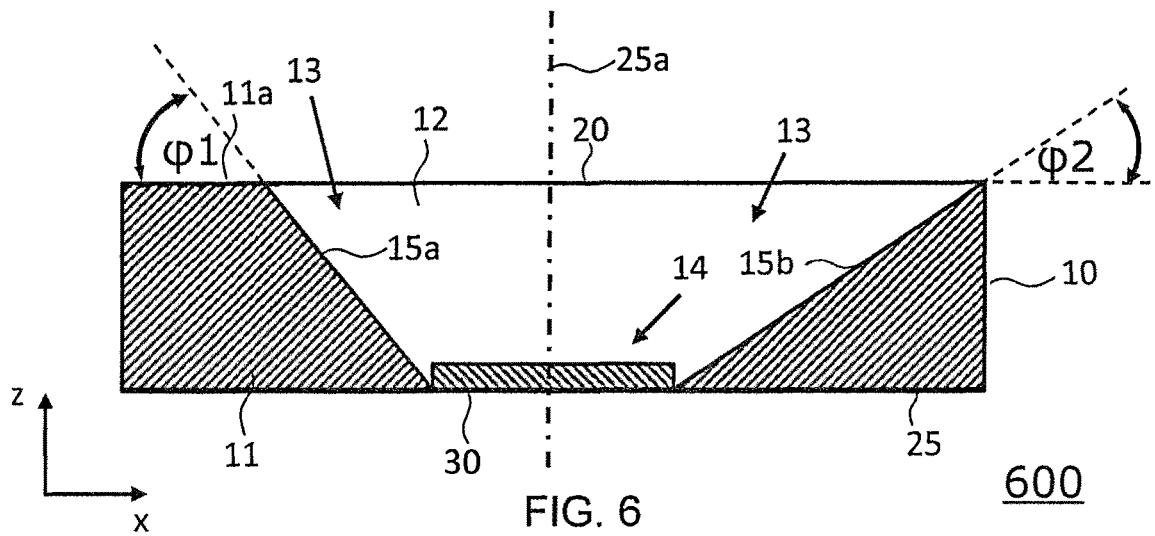
FIG. 6    600
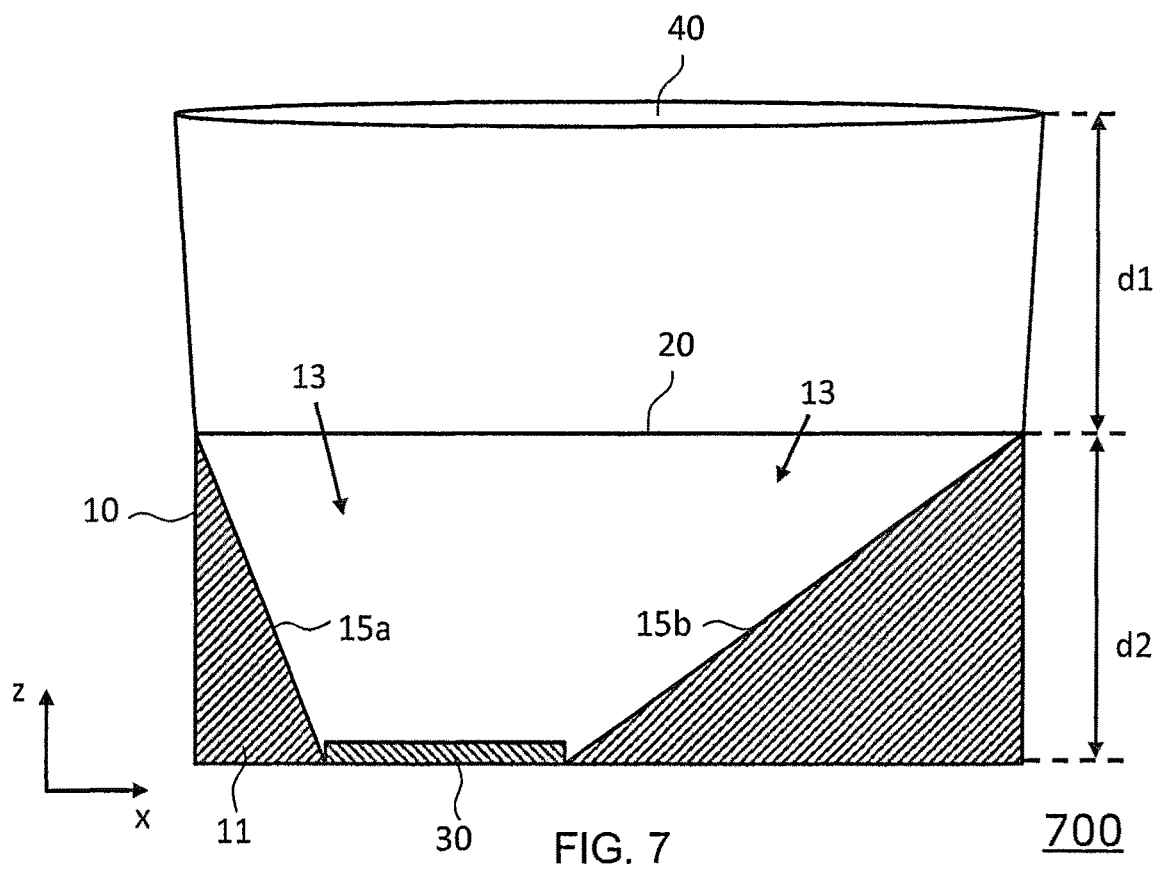
FIG. 7    700

CONCENTRATOR PHOTOVOLTAIC MODULE

CLAIM FOR PRIORITY

The present application is a national stage filing under 35 U.S.C 371 of PCT application number PCT/EP2019/061745, having an international filing date of May 7, 2019, the disclosure of which is hereby incorporated by reference in its entity.

FIELD OF INVENTION

The invention relates to a concentrator photovoltaic module comprising a photovoltaic chip. The invention further relates to a photovoltaic system comprising a plurality of concentrator photovoltaic modules. Further, the invention relates to a method of manufacturing a photovoltaic system.

BACKGROUND ART

Photovoltaics is the conversion of light energy, usually from sunlight, into electrical energy using solar cells or photovoltaic cells.

The concentrator photovoltaic uses lenses and/or reflectors to concentrate sunlight onto photovoltaic cells. This allows a reduction in cell size. The energy conversion is usually performed by a special high-performance solar cell, in particular by means of highly-efficient multiple (multi-junction) solar cells made of, for example, III-V semiconductor materials.

Concentrator photovoltaic systems are categorized by the amount of their solar concentration, measured in "suns". A distinction is made between low concentrator systems, medium concentrator systems and high concentrator systems.

As a rule, increasing concentration also increases the complexity of the system. In particular, the requirements for cooling and optics increase.

Low-concentrator systems often have a simple booster reflector, but in some cases this can already increase solar electrical output by more than 30% over non-concentrator systems.

High concentrator systems, on the other hand, use more complex optical systems. These can consist, for example, of a Fresnel lens as the primary optic and a reflector as the secondary optic.

DISCLOSURE OF THE INVENTION

It is an object of embodiments of the present invention to provide a concentrator photovoltaic module which avoids disadvantages of the prior art.

A further object of embodiments of the present invention is to provide a concentrator photovoltaic module that enables better utilization of solar energy, and in particular in a cost-effective and efficient manner.

A first aspect of the invention relates to a concentrator photovoltaic module according to claim 1.

Accordingly, the concentrator photovoltaic module has a housing, a photovoltaic chip, at least two electrical contacts for contacting the photovoltaic chip, and a transparent cover. The housing has a recess forming a receiving tray with a recessed bottom portion for receiving the photovoltaic chip. The receiving tray has sidewalls with at least a first reflective region and a second reflective region. The first reflective region is oriented at a first angle with respect to a horizontal plane of the housing, and the second reflective region is oriented at a second angle with respect to the horizontal plane of the housing. The first angle is different from the second angle.

A concentrator photovoltaic module embodied in this way makes it possible to select the two different angles of the first reflective region and the second reflective region individually and to adapt them to the respective external conditions, in particular the respective orientation of the surfaces intended for installation and the respective solar exposure of the surfaces intended for installation. The first and the second reflective regions form reflective surfaces which receive the sunlight via the transparent glass cover, reflect it and transmit it in the direction of the photovoltaic chip or concentrate it on the photovoltaic chip. Thus, the at least two reflective regions of the receiving tray form a reflector.

It should be noted here that the term horizontal plane of the housing refers to the base or bottom surface of the housing and, in particular, is intended to run parallel to the bottom surface of the housing. The term horizontal plane of the housing is thus not necessarily intended to refer to the particular installation situation of the housing. For example, when the housing is installed vertically on a wall of a house, the horizontal plane of the housing may be perpendicular to the floor of the house.

The transparent cover is preferably made of glass, in particular Gorilla® glass. According to preferred embodiments, the transparent or translucent cover allows the sunlight to pass as unhindered as possible into the reflector of the receiving tray and is therefore designed as a flat surface according to embodiments. In cross section, the transparent cover is in particular rectangular, whereby the thickness of the cover is selected to be as small as possible, for example 0.4 mm to 1 mm.

According to further embodiments, however, the transparent cover may also have a concave or convex shape and thus deflect and/or focus the sunlight.

According to embodiments, the photovoltaic chip can be designed as a single or multi-junction solar cell, in particular as a triple-junction or quadruple-junction solar cell. According to particularly preferred embodiments, the photovoltaic chip is a multi-junction solar cell made of a III-V semiconductor material, e.g. gallium arsenide (GaAs) or gallium antimonide (GaSb). In particular, the photovoltaic chip is implemented as a photovoltaic DIE, i.e., an unhoused piece of a semiconductor wafer.

The different angles of the first reflective region and the second reflective region can increase the concentrating or reflective effect and the efficiency of the concentrator photovoltaic module in a simple, cost-effective and efficient way.

According to one embodiment of the invention, the photovoltaic chip is arranged asymmetrically with respect to at least one vertical plane of symmetry of the housing. By means of such an asymmetrical arrangement of the photovoltaic chip in the housing, the different angles of the first and the second reflective region can be realized in a particularly efficient and space-saving manner in the housing.

According to another embodiment of the invention, the first and second reflective regions are opposite to each other with respect to a first vertical plane of symmetry of the photovoltaic chip. In other words, the first and second reflective regions are arranged on opposite sides of the photovoltaic chip.

Such an embodiment with opposing reflective surfaces with different angles allows for improved concentration of sunlight on the photovoltaic chip, in particular for sunlight that is not incident parallel to the first vertical plane of symmetry of the photovoltaic chip.

According to one embodiment of the invention, the first angle and the second angle differ from each other by at least 10°, in particular by at least 20°.

Such different angles are particularly advantageous if the solar radiation does not fall perpendicularly or symmetrically with respect to the perpendicular on the concentrator photovoltaic module. In such conditions, such different angles enable an improved optical concentration effect of the reflective regions or the reflective surfaces.

According to one embodiment of the invention, the module is designed as a surface-mountable module. This has particular advantages in terms of production technology. Such surface mountable modules, which are also referred to as SMD modules (Surface Mounted Device), can be assembled and processed in a particularly efficient and automated manner.

According to one embodiment of the invention, the at least two electrical contacts are arranged on at least two sides of the housing.

According to one embodiment of the invention, the at least two electrical contacts are arranged under the housing.

According to one embodiment of the invention, the housing has a base body made of plastic. Such a plastic housing can be manufactured in a simple and efficient manner by means of an injection moulding process, for example.

According to one embodiment of the invention, the first reflective region and the second reflective region are formed as a reflective coating of the receiving tray. According to embodiments, such a coating can be applied to the base body made of plastic, for example, by means of a corresponding coating process.

According to a further embodiment of the invention, the first reflective region and the second reflective region are formed as a reflective foil.

According to embodiments, such a reflective foil, e.g. a metal foil, can be applied to the base body made of plastic, e.g. by means of a corresponding adhesive process.

According to another embodiment of the invention, the first reflective region and the second reflective region are formed as a separate insert. The separate insert is inserted into the receiving tray of the housing.

In this embodiment, the first reflective region and the second reflective region form a separate reflector that is inserted into the recess. The separate reflector can be prefabricated and then inserted into and attached to the base body of the housing. This allows for great flexibility in manufacturing. For example, it is possible to manufacture the base body of plastic in large quantities by injection moulding. At the same time, the inserts can be made of plastic or metal. It is possible to prefabricate inserts with different angle combinations. These prefabricated inserts can then be inserted into the recesses of the base bodies in a next step and fastened to them, e.g. by ultrasonic welding. This makes it possible to install reflectors with different angle combinations in the same base bodies.

According to further embodiments of the invention, the receiving tray has sidewalls with a third reflective region and a fourth reflective region. The third reflective region is oriented at a third angle with respect to the horizontal plane of the housing, and the fourth reflective region is oriented at a fourth angle with respect to the horizontal plane of the housing. According to further embodiments, the third angle is different from the fourth angle.

Such embodiments thus have four different reflective regions or reflective surfaces, each of which may be oriented at individual and different angles with respect to the horizontal plane of the housing.

The four reflective regions form a reflector. The up to four different angles of the reflector enable a further improvement of the concentration effect or reflection effect of the reflector. In particular, according to embodiments of the invention, the reflector can be optimized with respect to both the elevation and the azimuth of the solar radiation. Thus, the reflector effect can be optimized for the particular location.

Thereby, two of the four angles, e.g. the first angle and the second angle, according to embodiments of the invention are in particular selected in such a way that they optimally take into account the respective installation situation of the module with respect to the elevation of the sun.

Furthermore, two of the four angles, e.g. the third angle and the fourth angle according to embodiments of the invention, are selected in such a way that they optimally take into account the respective installation situation of the module with respect to the azimuth of the sun. Thus, according to embodiments of the invention, concentrator photovoltaic modules can be manufactured in which the respective angular orientations of the reflector are optimally adapted to the intended installation situation of the module.

Accordingly, modules according to embodiments of the invention can be manufactured for vertical house walls, for pitched roofs as well as for flat roofs with optimized angle combinations in each case.

According to one embodiment, the third angle and the fourth angle differ by at least 10°, in particular by at least 20°.

Such different angles are particularly advantageous if the solar radiation does not fall perpendicularly or symmetrically with respect to a vertical plane of symmetry of the concentrator photovoltaic module. In such conditions, such different angles enable an improved optical concentration effect of the reflective regions or the reflective surfaces.

According to embodiments of the invention, the first angle, the second angle, the third angle and the fourth angle are in a range between 0° and 90°.

According to embodiments, the first angle can be in a range between 45° and 90°, in particular in a range between 60° and 75°, and the second angle can be in a range between 0° and 45°, in particular in a range between 10° and 35°. Such angles can be particularly advantageous for vertical installation situations.

According to further embodiments, the third angle can be in a range between 0° and 45°, in particular in a range between 10° and 35 and the fourth angle can be in a range between 30° and 90°, in particular in a range between 45° and 75°. Such angles can be particularly advantageous for matching the azimuthal course of the sun.

According to embodiments of the invention, the first and second reflective regions are opposite to each other with respect to a first vertical plane of symmetry of the photovoltaic chip, and the third and fourth reflective regions are opposite to each other with respect to a second vertical plane of symmetry of the photovoltaic chip. In particular, the first vertical plane of symmetry and the second vertical plane of symmetry are perpendicular to each other.

According to embodiments of the invention, the module is protected against solid foreign particles and against liquids. According to embodiments, the module has a scope of protection according to the International Protection (IP) code against solid foreign particles of at least 5 and a scope of protection against liquids of at least 5. A module protected in this way ensures reliable and long-lasting operation even under adverse environmental conditions. In particular, the module can be protected according to IP protection classes 65 to 68.

According to embodiments of the invention, the first reflective region, the second reflective region, the third reflective region and/or the fourth reflective region are each formed as a concave surface.

By means of such concave surfaces, the concentration effect of the reflective regions can be increased.

According to other embodiments of the invention, the first reflective region, the second reflective region, the third reflective region, and/or the fourth reflective region are each formed as a planar surface.

This is particularly advantageous in terms of manufacturing.

According to embodiments of the invention, the housing has an integrated bypass diode, in particular a Schottky diode. The bypass diode can in particular be integrated into the base body, which can be made in particular of plastic. Such an integration of the bypass diode in each individual module results in a particularly high reliability of the corresponding photovoltaic system. If a concentrator photovoltaic module is defective or not fully functional, the current can be bypassed via the bypass diode and the functionality of the overall system is not or hardly affected.

According to further embodiments of the invention, the concentrator photovoltaic module has a lens as the primary optic for focusing the sunlight. The lens is arranged at a predefined distance from the transparent cover. In such an embodiment, the reflective regions of the receiving tray forming a reflector act as secondary optics. By means of such a two-stage arrangement, the concentration effect can be further increased.

Another aspect of the invention relates to a photovoltaic system comprising a plurality of concentrator photovoltaic modules. In particular, the concentrator photovoltaic modules are mounted on a printed circuit board as surface-mounted components. The number of individual concentrator photovoltaic modules in such a system can be adapted to the desired performance and the respective intended application. A printed circuit board is generally understood here to mean a carrier for the concentrator photovoltaic modules. According to embodiments, the circuit board may be relatively rigid. According to other embodiments, however, the circuit board may also be formed as a flexible foil. According to embodiments, the circuit board may in particular comprise composite materials. According to embodiments, the printed circuit board may in particular comprise polyester, poly(p-phenylene terephthalamide), in particular Kevlar®, or carbon, or may consist of these materials.

BRIEF DESCRIPTION OF THE DRAWINGS

Further embodiments, advantages and applications of the invention are apparent from the dependent-claims and from the description which now follows with reference to the figures. Thereby showing:

FIG. 1b shows another cross-sectional view of the concentrator photovoltaic module shown in FIG. 1a;

FIG. 2b shows another cross-sectional view of the concentrator photovoltaic module shown in FIG. 2a;

FIG. 3 shows a cross-sectional view of a concentrator photovoltaic module according to one embodiment of the invention, including electrical connections arranged at the side of the module;

FIG. 4 shows a cross-sectional view of a concentrator photovoltaic module according to another embodiment of the invention with electrical connections below the module;

FIG. 5a shows a cross-sectional view of a concentrator photovoltaic module according to another embodiment of the invention with an inserted reflector;

FIG. 5b shows another cross-sectional view of the concentrator photovoltaic module shown in FIG. 5a;

FIG. 6 shows a cross-sectional view of a concentrator photovoltaic module according to another embodiment of the invention;

FIG. 7 shows a cross-sectional view of a concentrator photovoltaic module according to another embodiment of the invention;

MODES FOR CARRYING OUT THE INVENTION

Figure 1A:
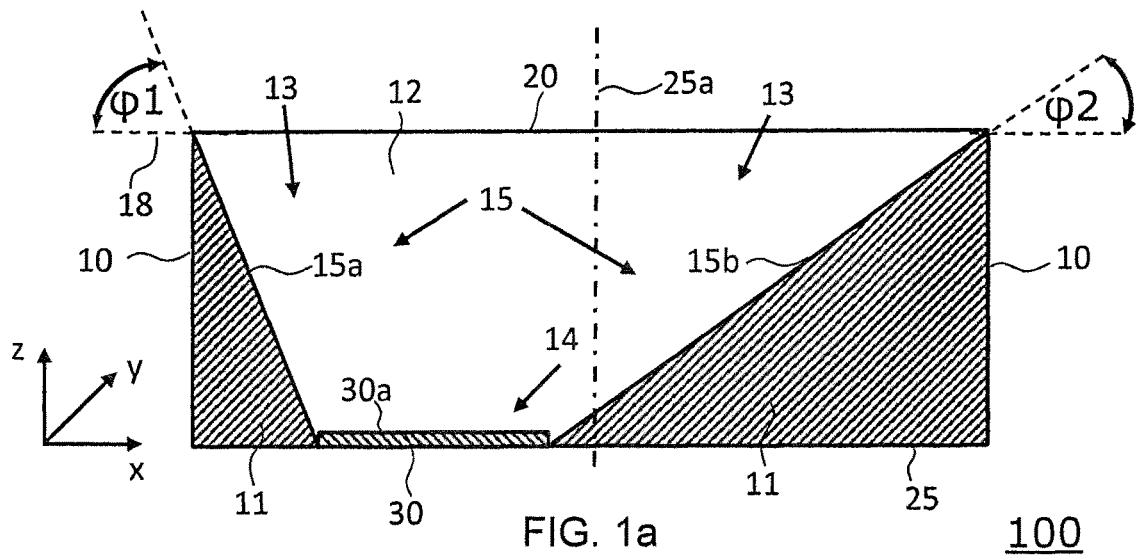
FIG. 1a shows a cross-sectional view of a concentrator photovoltaic module according to one embodiment of the invention.
Figure 1B:
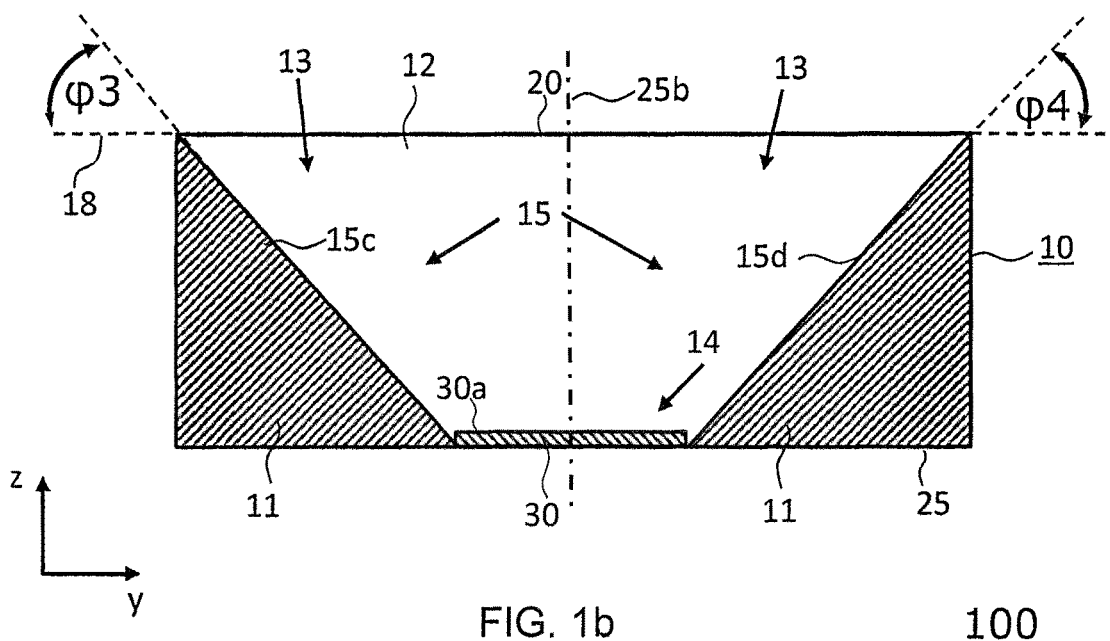
Figure 1C:
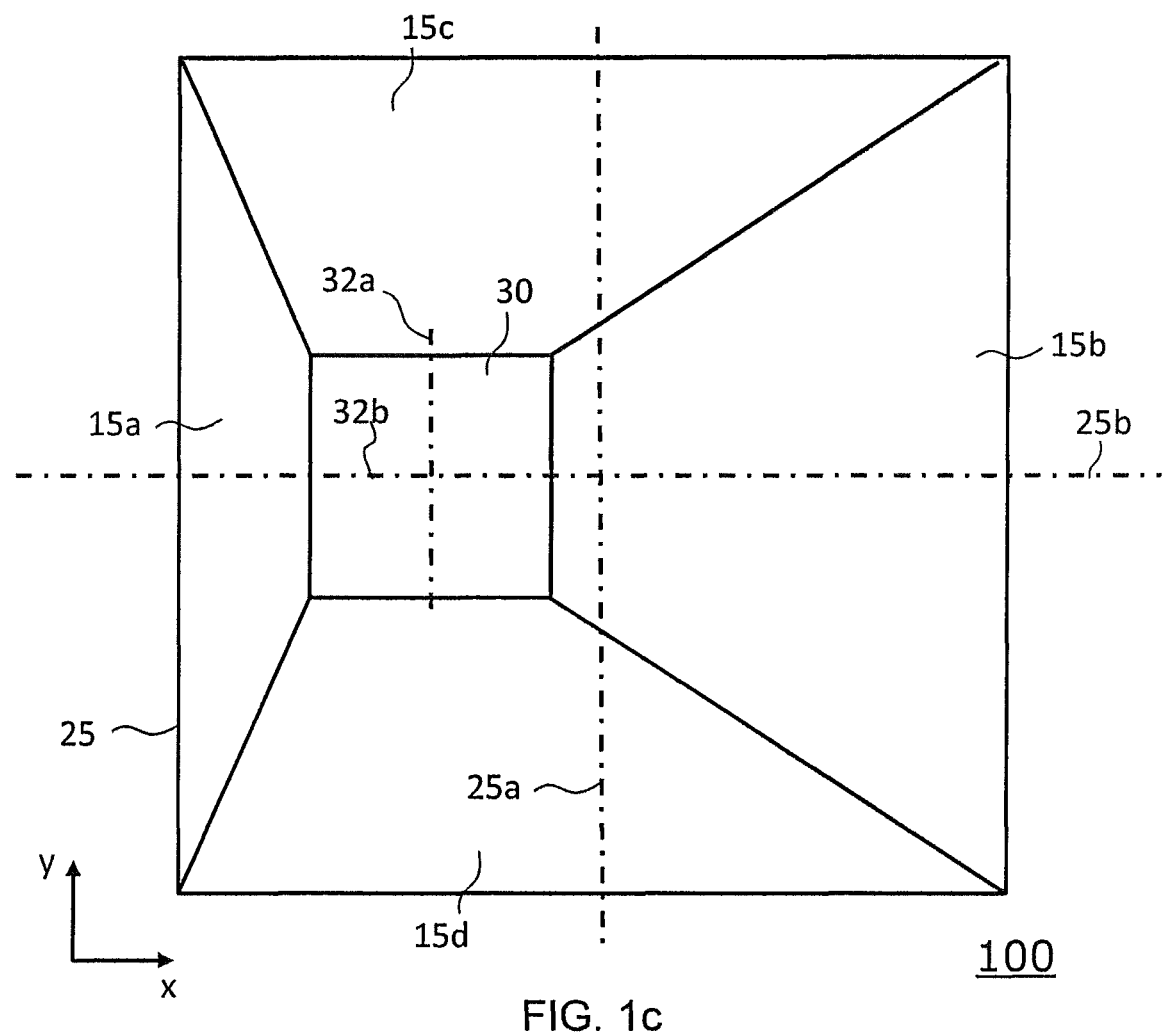
FIG. 1c shows a corresponding top view of the concentrator photovoltaic module shown in FIGS. 1a and 1b.

FIG. 1a shows a first cross-sectional view of a concentrator photovoltaic module 100 in an x-z plane according to one embodiment of the invention. FIG. 1b shows another cross-sectional view of the concentrator photovoltaic module 100 in a y-z plane perpendicular to the x-z plane. FIG. 1c shows a top view of the concentrator photovoltaic module 100 in the x-y plane.

The concentrator photovoltaic module 100 has a housing 10, which comprises a base body 11. The base body 11 may in particular be made of plastic and may be manufactured, for example, by means of an injection molding process. The housing 10 or the base body 11 has a recess 12. The recess 12 forms or establishes a receiving tray 13 having a recessed bottom portion 14 for receiving a photovoltaic chip 30. According to preferred embodiments of the invention, the photovoltaic chip 30 is formed as a multi-junction solar cell, but according to other embodiments of the invention, it can also be formed as a single-junction solar cell. According to embodiments of the invention, a photovoltaic chip means in particular a photovoltaic DIE, i.e. an unhoused piece of a semiconductor wafer with a multi-junction or single-junction solar cell.

The concentrator photovoltaic module 100 comprises at least two electrical contacts for contacting the photovoltaic chip 30, which are not shown in FIGS. 1*a* to 1*d* for ease of illustration. The concentrator photovoltaic module 100 further comprises a transparent cover 20 which closes the housing 10 and in particular the recess 12, in particular seals it in a waterproof and dustproof manner. According to embodiments, the transparent cover 20 is made of glass, in particular Gorilla glass. Preferably, the module 100 is protected against solid foreign particles and against liquids by means of the transparent cover 20. For this purpose, the module 100 may be designed in particular in accordance with IP protection class 66. According to embodiments, the module 100 has a scope of protection according to the International Protection (IP) code against solid foreign particles of at least 4 and a scope of protection against liquids of at least 4. The transparent cover 20 can be attached to the housing 10, in particular to the base body 11, by means of ultrasonic welding, for example.

The receiving tray 13 has sidewalls 15 with a first reflective region 15*a*, a second reflective region 15*b*, a third reflective region 15*c*, and a fourth reflective region 15*d*. The first reflective region 15*a* is oriented at a first angle $\varphi 1$ with respect to a horizontal x-y plane 18 of the housing 10. The second reflective region 15*b* is oriented at a second angle $\varphi 2$ with respect to the horizontal x-y plane 18 of the housing 10. The third reflective region 15*c* is oriented at a third angle $\varphi^3$ with respect to the horizontal x-y plane 18 of the housing 10. The fourth reflective region 15*d* is oriented at a fourth angle $\varphi^4$ with respect to the horizontal x-y plane 18 of the housing. According to the embodiment illustrated in FIGS. 1*a* to 1*d*, the first angle $\varphi 1$ is different from the second angle $\varphi 2$, while the third angle $\varphi 3$ and the fourth angle $\varphi 4$ are equal or approximately equal in this example.

As can be seen in particular from FIGS. 1*a* and 1*b*, the photovoltaic chip 30 is arranged asymmetrically with respect to the vertical symmetry plane 25*a* of the housing 10, while it is arranged symmetrically with respect to the vertical symmetry plane 25*b* of the housing 10.

As can be seen in particular from FIGS. 1*a* and 1*c*, the first reflective region 15*a* and the second reflective region 15*b* are opposite to each other with respect to the photovoltaic chip 30, in particular with respect to a first vertical symmetry plane (32*a*) of the photovoltaic chip (30) shown in FIG. 1*c*.

In other words, the first reflective region 15*a* is located on one side of the photovoltaic chip 30 and the second reflective region 15*b* is located on the opposite side of the photovoltaic chip 30. According to the example shown, the first angle $\varphi 1$ is approximately 65° and the second angle $\varphi 2$ is approximately 35°.

According to embodiments of the invention, the angles $\varphi 1$, $\varphi 2$, $\varphi 3$ and $\varphi 4$ are in a range between 0° and 90°. According to preferred embodiments of the invention, the first angle $\varphi 1$ is in a range between 45° and 90°, in particular in a range between 60° and 75°, and is thus relatively steep, while the second angle $\varphi 2$ is in a range between 0° and 45°, in particular in a range between 10° and 35°, and is thus relatively flat. Such an embodiment is advantageous, for example, for photovoltaic modules which are mounted on vertical house walls. This makes it possible to significantly improve the power yield of the photovoltaic module when mounted on vertical house walls, in that in particular the "lower" reflective surface is more inclined with respect to the horizontal plane of the housing than the "upper" reflective surface.

According to embodiments, the first reflective region 15*a*, the second reflective region 15*b*, the third reflective region 15*c*, and the fourth reflective region 15*d* are applied as a coating to the base body 11 of the receiving tray 13.

According to other embodiments, the first reflective region 15*a*, the second reflective region 15*b*, the third reflective region 15*c* and the fourth reflective region 15*d* are formed as a reflective foil, which can be applied to the base body 11 of the receiving tray 13, for example, by means of adhesive or other processes.

According to the embodiments shown in FIGS. 1*a* to 1*d*, the reflective regions 15*a*, 15*b*, 15*c* and 15*d* are each embodied as planar surfaces, in particular as trapezoidal surfaces.

However, according to other embodiments not shown, the reflective regions 15*a*, 15*b*, 15*c*, and 15*d* may have other shapes, particularly concave shapes and convex shapes.

The receiving tray 13 with reflective regions 15*a*, 15*b*, 15*c*, and 15*d* is configured as a reflector for a concentrator photovoltaic system. Incident sunlight is transmitted by the transparent cover 20 and concentrated onto the surface 30*a* of the photovoltaic chip 30 by means of the reflective regions 15*a*, 15*b*, 15*c* and 15*d*.

A module embodied in such a way allows the angles $\varphi 1$, $\varphi 2$, $\varphi 3$ and $\varphi 4$ of the reflective regions 15*a* 15*b*, 15*c* and 15*d* to be selected individually and differently in each case and to be adapted to the intended location, the respective orientation of the modules on the surfaces intended for installation and the corresponding solar exposure of the modules both in terms of the azimuthal course and in terms of the elevation.

Figure 2A:
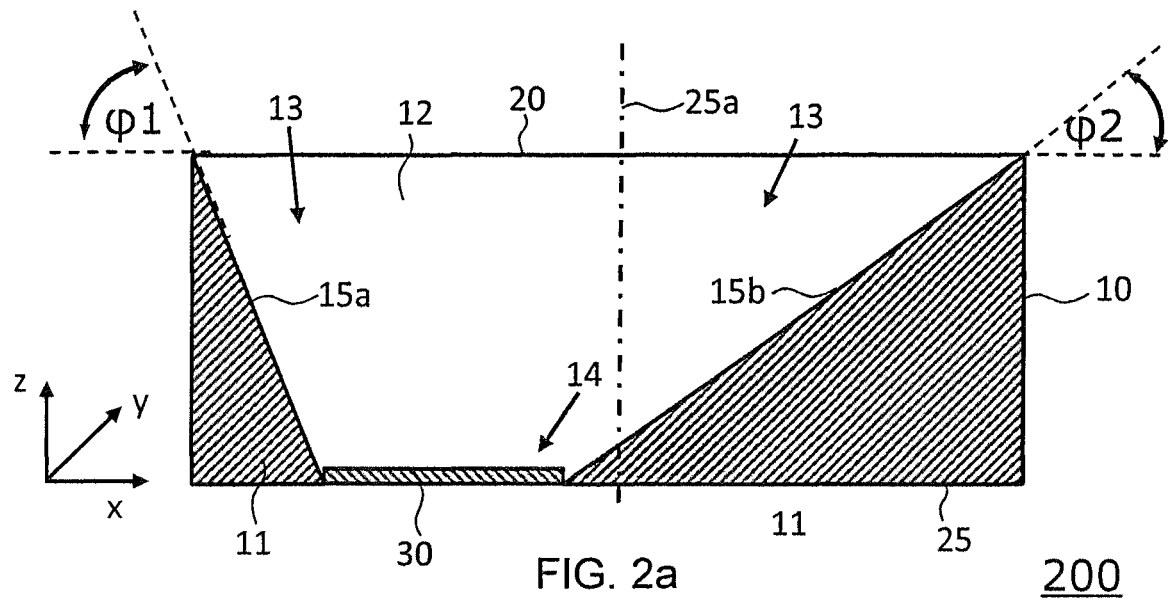
FIG. 2a shows a cross-sectional view of a concentrator photovoltaic module according to another embodiment of the invention.
Figure 2B:
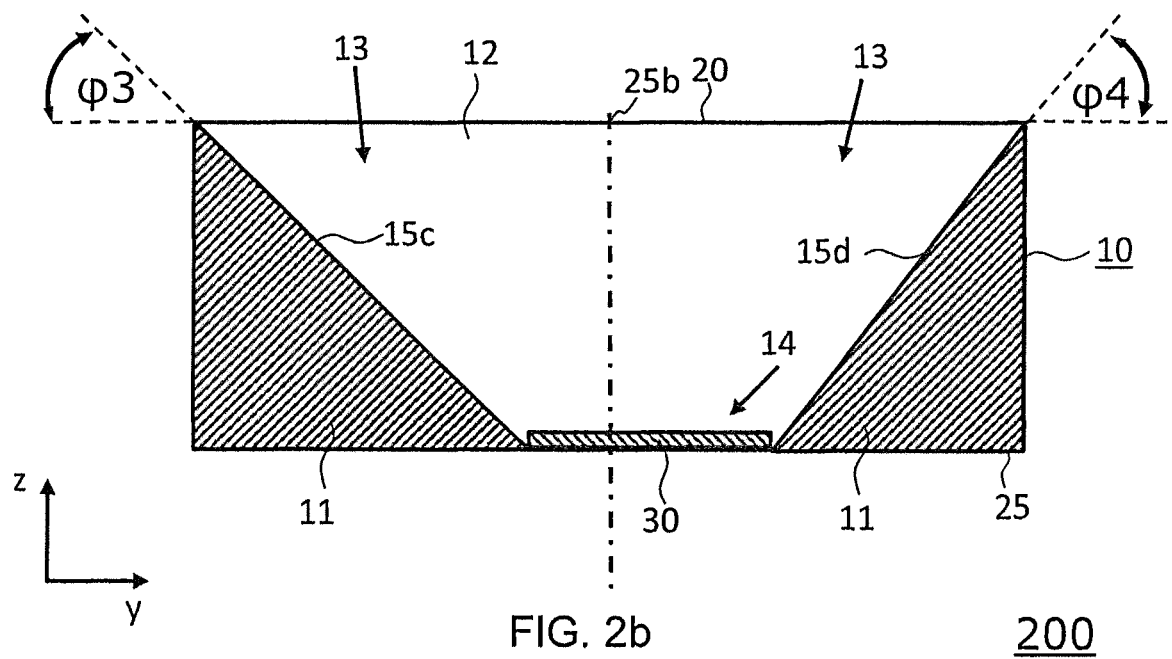
Figure 2C:
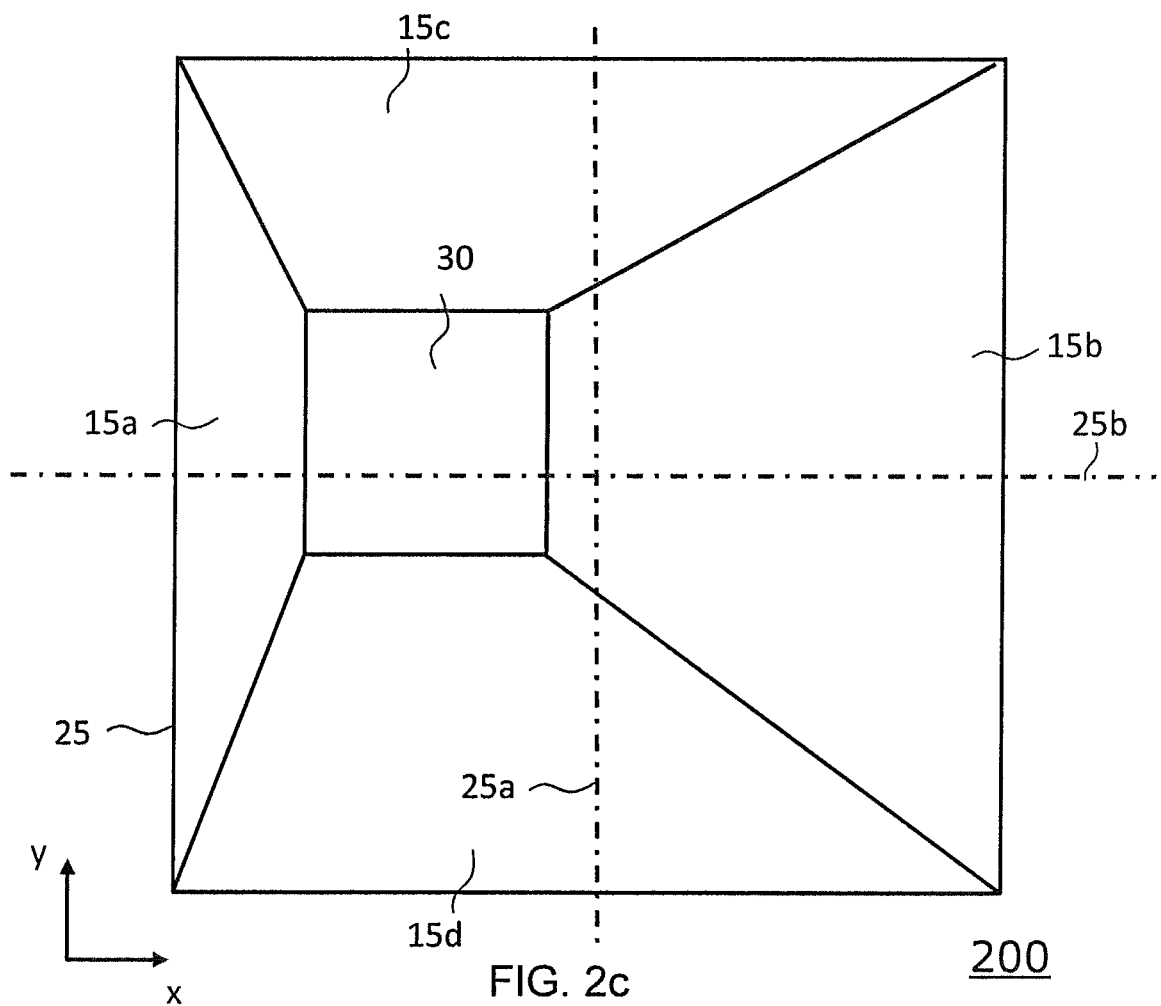
FIG. 2c shows a corresponding top view of the concentrator photovoltaic module shown in FIGS. 2a and 2b.

FIG. 2*a* shows a first cross-sectional view of a concentrator photovoltaic module 200 in an x-z plane according to one embodiment of the invention. FIG. 2*b* shows another cross-sectional view of the concentrator photovoltaic module 200 in a y-z plane perpendicular to the x-z plane. FIG. 2*c* shows a top view of the concentrator photovoltaic module 200 in the x-y plane. In contrast to the concentrator photovoltaic module 100, not only the first angle $\varphi 1$ and the second angle $\varphi 2$ are different in the concentrator photovoltaic module 200, but also the third angle $\varphi 3$ and the fourth angle $\varphi 4$. According to embodiments, the third angle $\varphi 3$ and the fourth angle $\varphi 4$ differ by at least 10°.

The third angle $\varphi 3$ is preferably in a range between 0° and 450, in particular in a range between 10° and 35°, while the fourth angle $\varphi 4$ is preferably in a range between 30° and 90°, in particular in a range between 45° and 75°.

FIG. 3 shows a cross-sectional view of a concentrator photovoltaic module 300 in an x-z plane according to an embodiment of the invention. In FIG. 3, the electrical connections of the module are shown in more detail. In particular, the concentrator photovoltaic module 300 has a first electrical contact 31*a* and a second electrical contact 32*a*. The electrical contacts 31*a*, 32*a* are arranged on opposite sides of the housing 10 and are formed as so-called leads, which are embedded in the base body 11 made of plastic. The photovoltaic chip 30 is electrically connected to the leads of the electrical contacts 31*a* and 32*a* by wire bonding. Thus, the module 300 is embodied as a surface mountable module in SMD-technology (Surface Mount Technology). The module 300 also has a bypass diode 35 integrated into the housing 10, which may in particular be embodied as a Schottky diode. The bypass diode is connected in parallel with the photovoltaic chip 30 and accordingly connected on the one hand to the electrical contact 31*a* and on the other hand to the electrical contact 31*b*, also according to embodiments by means of wire bonding. The photovoltaic chip 30 can, for example, be electrically contacted with conductor paths of a printed circuit board 37 by means of soldering. Below the photovoltaic chip 30, the printed circuit board 37 has thermal feedthroughs/vias 38, which are provided for dissipating the heat produced by the photovoltaic chip 30 to a thermal pad 39.

FIG. 4 shows a cross-sectional view of a concentrator photovoltaic module 400 in an x-z plane according to another embodiment of the invention. FIG. 4 also shows the electrical connections of the module in more detail. According to the embodiment of FIG. 4, the concentrator photovoltaic module 400 has two electrical contacts 31a, 31b arranged under the housing 10.

Figure 5C:
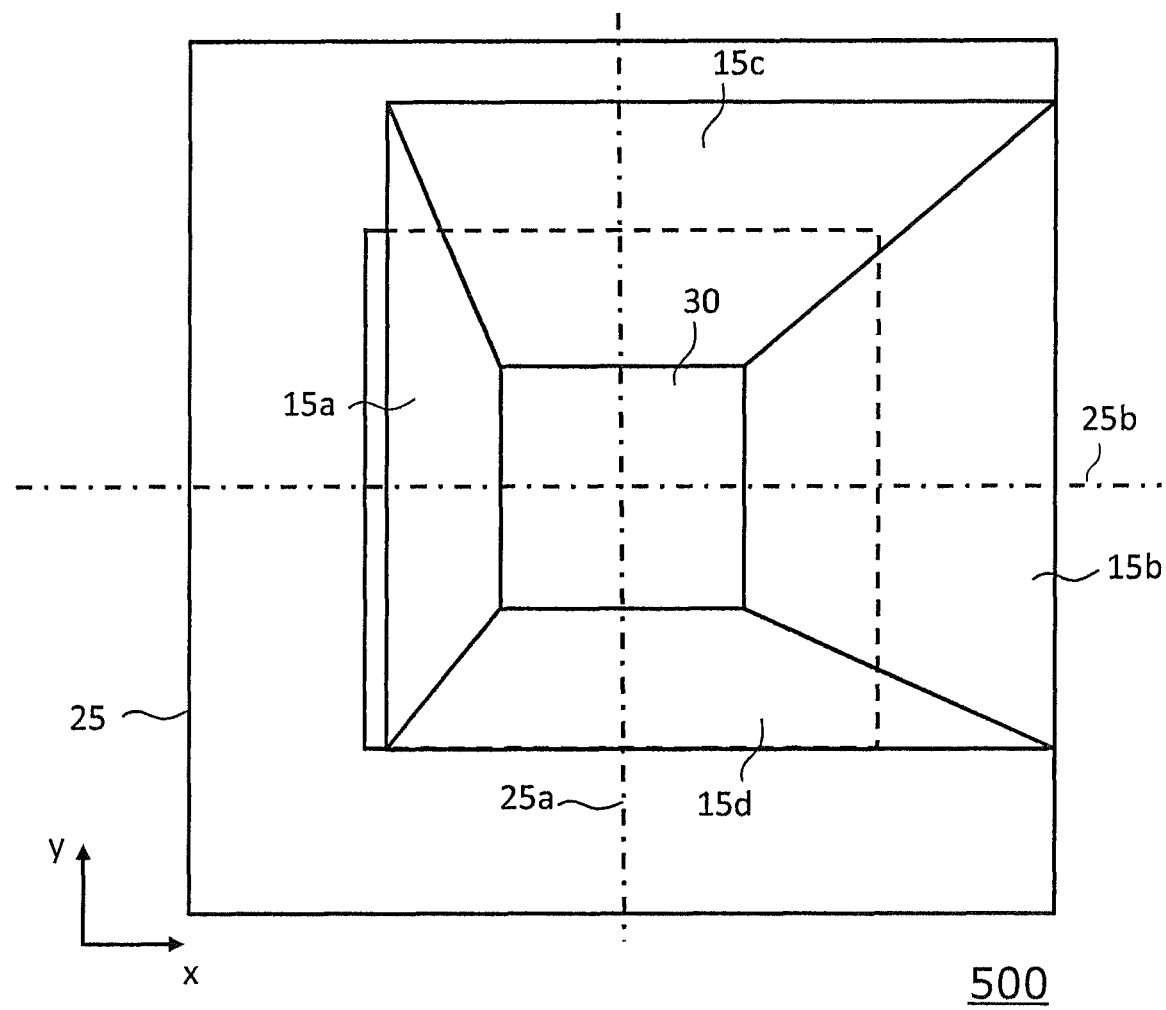
FIG. 5c shows a top view of the concentrator photovoltaic module shown in FIGS. 5a and 5b.

FIG. 5a shows a first cross-sectional view of a concentrator photovoltaic module 500 in an x-z plane according to another embodiment of the invention. FIG. 5b shows another cross-sectional view of the concentrator photovoltaic module 500 in a y-z plane perpendicular to the x-z plane. FIG. 5c shows a top view of the concentrator photovoltaic module 500 in the x-y plane.

According to this embodiment, the reflective side walls with the reflective regions are not applied directly to the base body 11 of the housing 10, but are formed as a separate insert 50, which is inserted into the receiving tray 13. The separate insert 50 can be attached to the housing 10 by means of ultrasonic welding, for example. According to other embodiments, the separate insert 50 may be attached to predefined attachment points of the housing 10 by means of a click system. According to other embodiments, the separate insert 50 may be attached to the housing 10 using adhesive or another suitable attachment technique. In particular, the separate insert 50 may be a metal insert or a plastic insert. According to this embodiment, the different angles $\varphi 1$, $\varphi 2$, $\varphi 3$ and $\varphi 4$ of the reflective regions are realized by means of the separate insert 50, while the side walls 11a, 11b, 11c and 11d of the base body 11 may have the same angle. This allows to manufacture the base body 11 in large quantities and the individual adaptation of the angles to be implemented by means of the separate insert 50.

FIG. 6 shows a cross-sectional view of a concentrator photovoltaic module 600 in an x-z plane according to another embodiment of the invention. According to this embodiment, the photovoltaic chip is arranged symmetrically with respect to the vertical symmetry plane 25a of the housing 10. Nevertheless, in order to realize different angles $\varphi 1$ and $\varphi 2$, the base body 11 comprises a relatively wide top side 11a on the left side.

FIG. 7 shows a cross-sectional view of a concentrator photovoltaic module 700 in an x-z plane according to another embodiment of the invention.

The concentrator photovoltaic module comprises a lens 40 as the primary optic for focusing sunlight, in addition to the reflective receiving tray 13 acting as a secondary optic. The lens 40 is fixed at a predefined distance d1 from the glass cover 20 of the housing 10. The height of the housing 10 is denoted by d2. According to embodiments of the invention, the height d2 of the housing 10 is between 3 mm and 6 mm.

Figure 11:
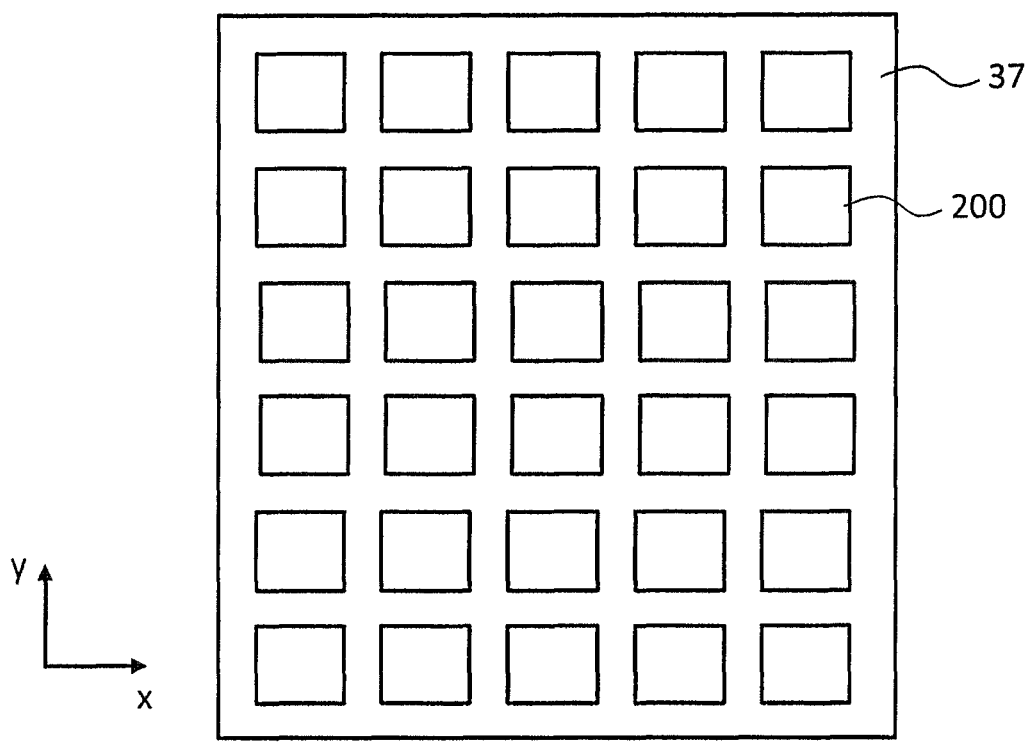
FIG. 11 shows a top view of a photovoltaic system with a plurality of concentrator photovoltaic modules.
Figure 12:
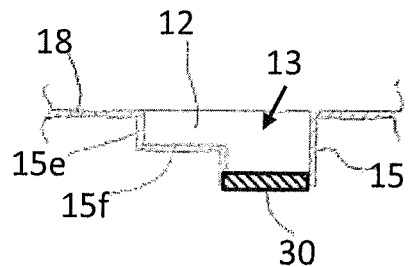
FIGS. 12 to 15 show further exemplary cross-sectional views of concentrator photovoltaic modules according to further embodiments of the invention, in particular with stepped side walls of the receiving tray.
Figure 13:
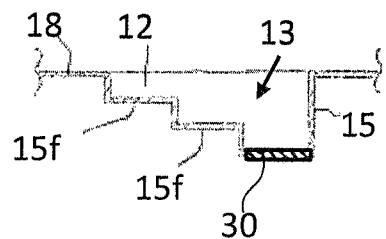
Figure 14:
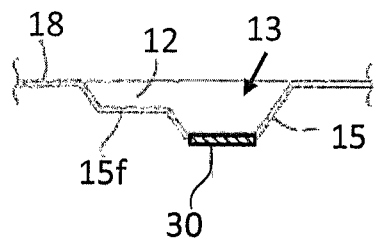
Figure 15:
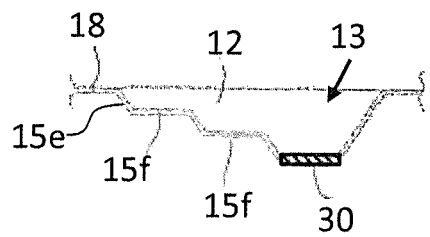

FIG. 11 shows a top view of a photovoltaic system 1100 according to one embodiment of the invention. The photovoltaic system 1100 comprises a plurality of the concentrator photovoltaic modules described above, e.g., a plurality of the photovoltaic modules 200. The concentrator photovoltaic modules 200 are mounted on a printed circuit board 37 as surface-mounted components. In particular, the printed circuit board 37 may be formed as a flexible foil.

Figure 8:
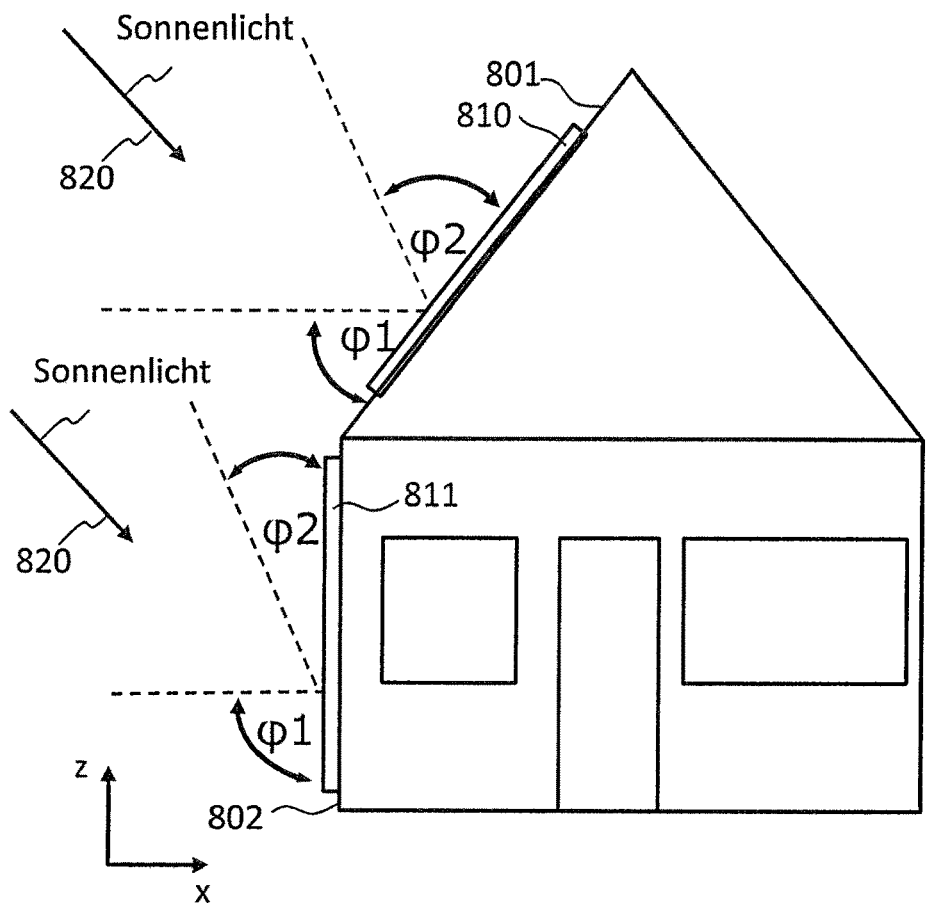
FIG. 8 shows a side view of a house with a pitched roof and photovoltaic systems arranged on the roof and on side walls.

FIG. 8 shows a side view of a house 800. The house 800 has a photovoltaic system 810 on a pitched roof 801 and a photovoltaic system 811 on a vertical side wall 802.

Figure 9:
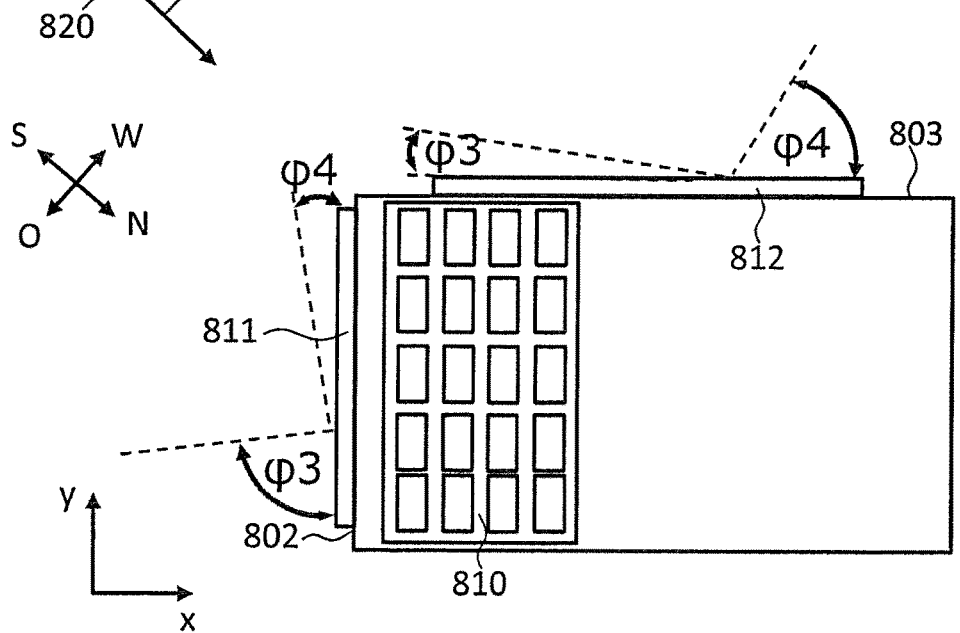
FIG. 9 shows a top view of the house shown in FIG. 8.

FIG. 9 shows a top view of the house 800, showing that in addition to the photovoltaic system 810 and the photovoltaic system 811, the house 800 has another photovoltaic system 812 on the back wall 803.

The photovoltaic systems 810, 811, and 812 include a plurality of the concentrator photovoltaic modules described above and may be embodied particularly as shown in the top view of FIG. 11.

In FIGS. 8 and 9, the position of the sun 820 is shown in an exemplary manner, e.g., at noon time.

In addition, in FIG. 8, the first angle $\varphi 1$ and the second angle $\varphi 2$ of the individual concentrator photovoltaic modules of systems 810 and 811 are shown in an exemplary manner by means of dashed lines.

Furthermore, in FIG. 9, the third angle $\varphi 3$ and the fourth angle $\varphi 4$ of the individual concentrator photovoltaic modules of systems 810 and 812 are shown in an exemplary manner by means of dashed lines.

In the example of FIGS. 8 and 9, the individual concentrator photovoltaic modules of systems 810, 811 and 812 each have different combinations of the individual angles $\varphi 1$, $\varphi 2$, $\varphi 3$ and $\varphi 4$. This makes it possible to take into account the respective installation situation of the systems 810, 811 and 812 and to optimally adapt the angles $\varphi 1$, $\varphi 2$, $\varphi 3$ and $\varphi 4$ to the position of the sun or the course of the sun in order to achieve a maximum concentrator effect or amplification of the reflector.

According to embodiments of the invention, the first angle 91 and the second angle $\varphi 2$ are in particular selected in such a way that they optimally take into account the respective installation situation with respect to the elevation of the sun.

According to embodiments of the invention, the third angle $\varphi 3$ and the fourth angle $\varphi 4$ are in particular selected in such a way that they optimally take into account the respective installation situation with respect to the azimuth of the sun. Thus, FIG. 9 also shows the orientation of the house with respect to the cardinal directions. Exemplarily, the house wall 802 has a southeast exposure and the rear wall 803 has a southwest exposure. By appropriately and individually choosing the angles $\varphi 3$ and $\varphi 4$ for the side wall 802 and the back wall 803, the efficiency of the concentrator photovoltaic module can be improved.

Figure 10:
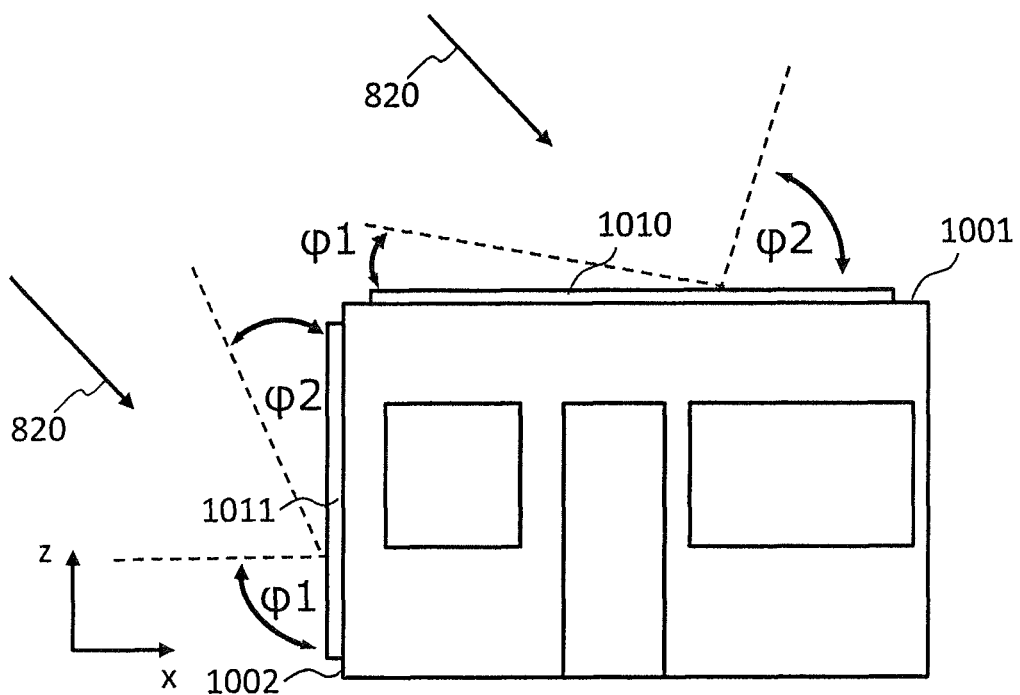
FIG. 10 shows a side view of a house with a flat roof and a photovoltaic system arranged on the flat roof.

FIG. 10 shows a side view of a house 1000 with a flat roof 1001. A photovoltaic system 1010 is mounted on the flat roof 1001 and a photovoltaic system 1011 is mounted on a vertical side wall 1002.

The first angle $\varphi 1$ and the second angle $\varphi 2$ of the photovoltaic system 1010 are chosen differently from the first angle $\varphi 1$ and the second angle $\varphi 2$ of the photovoltaic system 810 of the pitched roof shown in FIG. 8 to improve the reflector effect of the concentrator photovoltaic modules.

While preferred embodiments of the invention are described in the present application, it should be clearly understood that the invention is not limited to these and may be carried out in other ways as well within the scope of the following claims.

The invention claimed is:

1. A concentrator photovoltaic module, comprising:
   a housing;
   a photovoltaic chip;
   at least two electrical contacts for contacting the photovoltaic chip; and
   a transparent cover;
   wherein
   the housing has a recess forming a receiving tray with a recessed bottom portion for receiving the photovoltaic chip;

the receiving tray has side walls with at least a first and a second reflective region, the first reflective region being oriented at a first angle with respect to a horizontal plane of the housing and the second reflective region being oriented at a second angle with respect to the horizontal plane of the housing; and the first angle is different from the second angle; and wherein the concentrator photovoltaic module is formed as a surface mountable module (SMD) in SMD technology.

2. The concentrator photovoltaic module according to claim 1, wherein the photovoltaic chip is arranged asymmetrically with respect to at least one vertical symmetry plane of the housing.

3. The concentrator photovoltaic module according to claim 1, wherein the first and the second reflective regions are opposite to each other with respect to a first vertical symmetry plane of the photovoltaic chip.

4. The concentrator photovoltaic module according to claim 1, wherein the first angle and the second angle differ by at least 10°.

5. The concentrator photovoltaic module according to claim 1, wherein the at least two electrical contacts are arranged on at least two sides of the housing.

6. The concentrator photovoltaic module according to claim 1, wherein the at least two electrical contacts are arranged under the housing.

7. The concentrator photovoltaic module according to claim 1, wherein the first reflective region and the second reflective region are formed as a reflective coating of the receiving tray.

8. The concentrator photovoltaic module according to claim 1, wherein the first reflective region and the second reflective region are formed as a reflective foil.

9. The concentrator photovoltaic module according to claim 1, wherein the first reflective region and the second reflective region are formed as a separate insert which is inserted into the receiving tray of the housing.

10. The concentrator photovoltaic module according to claim 1, wherein the first angle is in a range between 0° and 90°; and
the second angle is in a range between 0° and 90°.

11. The concentrator photovoltaic module according to claim 1, wherein the receiving tray comprises side walls having a third and a fourth reflective region, wherein the third reflective region is oriented at a third angle with respect to the horizontal plane of the housing and the fourth reflective region is oriented at a fourth angle with respect to the horizontal plane of the housing, wherein in particular the third angle is different from the fourth angle.

12. The concentrator photovoltaic module according to claim 11, wherein the third angle and the fourth angle differ by at least 10°.

13. The concentrator photovoltaic module according to claim 11, wherein the first and second reflective regions are opposite to each other with respect to a first vertical symmetry plane of the photovoltaic chip, and wherein the third and fourth reflective regions are opposite to each other with respect to a second vertical symmetry plane of the photovoltaic chip, and wherein in particular the first vertical symmetry plane and the second vertical symmetry plane are perpendicular to each other.

14. The concentrator photovoltaic module according to claim 11, wherein, the third angle is in a range between 0° and 45°; and
the fourth angle is in a range between 30° and 90°.

15. The concentrator photovoltaic module according to claim 1, wherein the housing comprises an integrated bypass diode.

16. The concentrator photovoltaic module according to claim 1, wherein the receiving tray is configured as a secondary reflector for a concentrator photovoltaic system.

17. The concentrator photovoltaic module according to claim 1, wherein the photovoltaic chip is a multi-junction solar cell.

18. The concentrator photovoltaic module according to claim 1, comprising:

a lens as primary optics for focusing the sunlight, the lens being arranged at a predefined distance from the transparent cover.

* * * * *